United States Patent [19]

Hofmann

[11] 4,122,362
[45] Oct. 24, 1978

[54] STEPPED PULSE GENERATOR CIRCUIT

[75] Inventor: Gerhard Hofmann, Heilbronn, Germany

[73] Assignee: Licentia Patent-Verwaltungs-G.m.b.H., Frankfurt am Main, Germany

[21] Appl. No.: 767,029

[22] Filed: Feb. 9, 1977

[30] Foreign Application Priority Data

Feb. 12, 1976 [DE] Fed. Rep. of Germany ....... 2605498

[51] Int. Cl.² ............................................. H03K 4/02
[52] U.S. Cl. .................................. 307/227; 307/360; 328/143; 328/186; 330/252
[58] Field of Search ............... 328/158, 159, 186, 187, 328/142, 143; 307/227, 360; 330/252, 261, 257

[56] References Cited

U.S. PATENT DOCUMENTS

| | | | |
|---|---|---|---|
| 3,216,005 | 11/1965 | Hoffman et al. | 307/360 X |
| 3,280,261 | 10/1966 | Korn | 307/360 X |
| 3,593,035 | 7/1971 | Martens | 307/360 X |
| 3,688,128 | 8/1972 | Van Essen et al. | 307/360 X |
| 3,838,262 | 9/1975 | van de Plassche | 330/257 X |
| 3,932,768 | 1/1976 | Takahashi et al. | 330/257 X |
| 3,952,213 | 4/1976 | Fukaya | 307/360 X |
| 4,032,797 | 6/1977 | Metcalf et al. | 307/227 |

*Primary Examiner*—John S. Heyman
*Attorney, Agent, or Firm*—Spencer & Kaye

[57] ABSTRACT

A stepped pulse generator circuit has an input line for receiving a sawtooth form voltage and an output line for providing a step-shaped pulse. First and second differential amplifiers each have first and second transistors the first transistor of each differential amplifier has its base electrode coupled to the input line. A common load resistor for the differential amplifiers is coupled to the collector electrode of the first transistor of the first differential amplifier, to the collector electrode of the second transistor of the secon differential amplifier and to the output line. A biasing circuit is coupled with the base electrode of the second transistor of the first differential amplifier and with the base electrode of the second transistor of the second differential amplifier and is arranged to provide a different bias potential on each base electrode. Current supply is provided to the emitter electrodes of the transistors of the first and second differential amplifiers.

7 Claims, 7 Drawing Figures

STEPPED PULSE GENERATOR CIRCUIT

BACKGROUND OF THE INVENTION

This invention relates to a stepped pulse generator which provides a stepped pulse output in response to the input of a signal of sawtooth form.

In integrated circuit technology it is advantageous to work with step-shaped pulses in order to transmit multiple informations by means of a combined pulse and in order to save connecting points.

SUMMARY OF THE INVENTION

The invention seeks to provide a circuit arrangement which is suitable for manufacture in integrated semiconductor technology and which supplies step-shaped pulses.

According to the invention there is provided a stepped pulse generator circuit comprising an input line for a sawtooth waveform, an output line for a stepped pulse waveform, first and second differential amplifiers each comprising first and second transistors, the first transistor of each said differential amplifier having its base electrode coupled to said input line, a common load resistor for the differential amplifiers coupled to the collector electrode of the first transistor of the first differential amplifier, to the collector electrode of the second transistor of the second differential amplifier and said output line, biassing means coupled with the base electrode of the second transistor of the first differential amplifier and the base electrode of the second transistor of the second differential amplifier adapted to provide different bias potentials thereto and current supply means coupled with the emitter electrodes of the transistors of the first and second differential amplifiers.

Further according to the invention, there is provided a circuit arrangement for producing a stepped pulse, characterized in that at least two differential amplifiers are provided each of which has a first and a second transistor; that the bases of the first transistors are connected together and a saw-tooth voltage is supplied to them; that the base potentials of the second transistors are different and are chosen such that they lie between the end potentials of the sawtooth voltage; that the collector of the first transistor of a differential amplifier and the collector of the second transistor of the other differential amplifier have a common collector resistor and that both differential amplifiers obtain the same current.

BRIEF DESCRIPTION OF THE DRAWINGS

In order that the invention and its various other preferred features may be understood more easily an embodiment thereof will now be described, by way of example, with reference to the drawings, in which.

DESCRIPTION OF A PREFERRED EMBODIMENT

In a preferred embodiment of the invention a circuit arrangement as stated at the outset is proposed in which at least two differential amplifiers are provided each of which has a first transistor and a second transistor; in that bases of the first transistors are connected together and a saw-tooth voltage is supplied to them; that the base potentials of the second transistors are different and such that they lie between the end potentials of the saw-tooth voltage; that the collector of the first transistor of one differential amplifier and the collector of the second transistor of the other differential amplifier have a common collector resistor; and that both differential amplifiers obtain the same current.

Preferably transistors of a current mirror circuit are provided as current sources for the differential amplifiers, these supplying the same current. The saw-tooth voltage is preferably produced by a RC network. As the saw-tooth voltage is only required temporarily a switch is provided which short-circuits the capacitor for the remaining time.

Figure 1:
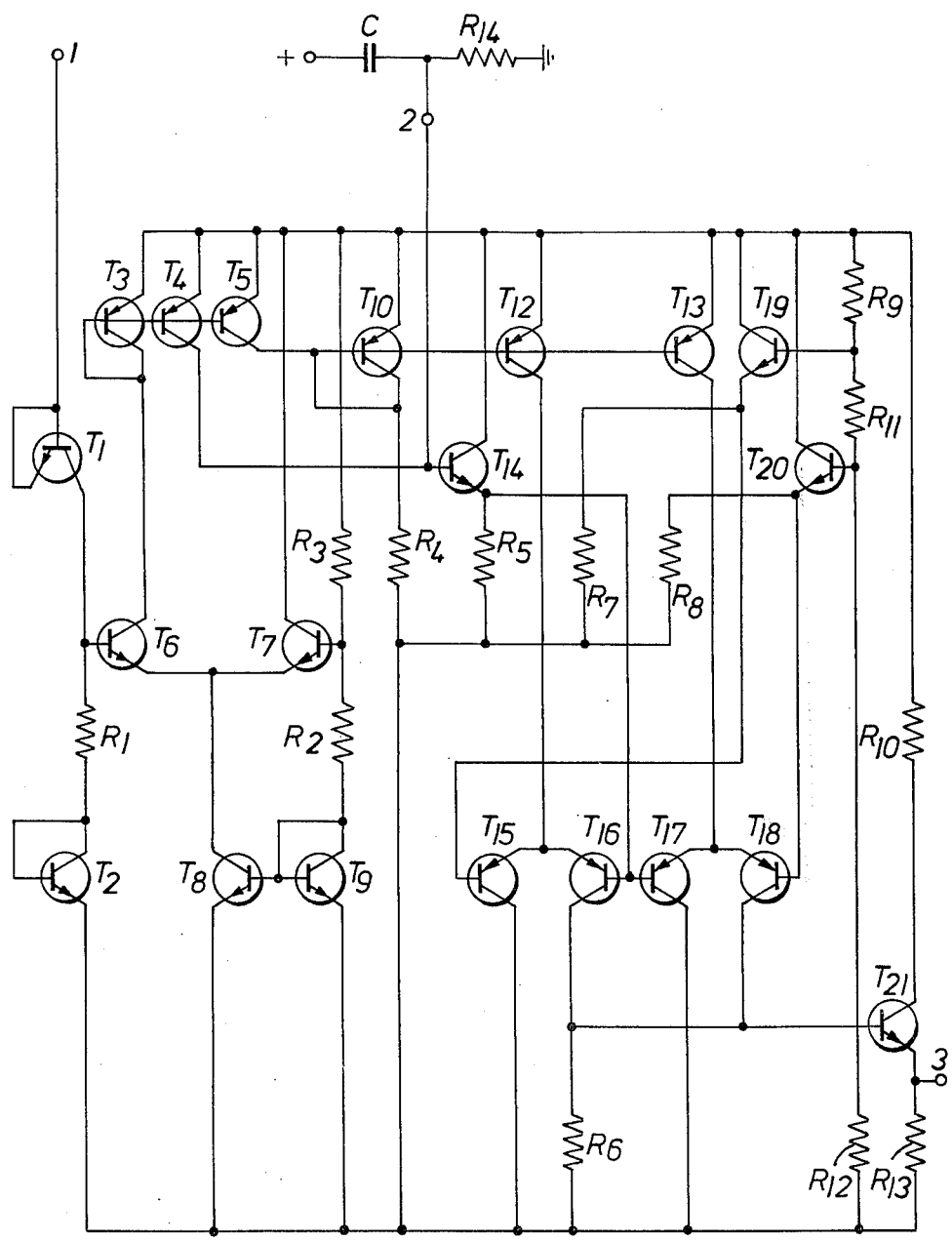
FIG. 1 shows a circuit arrangement for a colour television receiver, a negative line flyback pulse being supplied at the input 1 to the circuit arrangement and this circuit arrangement supplies a step-shaped pulse at the output 3, the pulse being synchronous with the line flyback pulse.

Referring now to the circuit of FIG. 1, this has two differential amplifiers; one differential amplifier comprises the transistors $T_{15}$ and $T_{16}$ and the other differential amplifier comprises the transistors $T_{17}$ and $T_{18}$. As is shown in FIG. 1 the bases of the two first transistors $T_{16}$ and $T_{17}$ of the differential amplifiers obtain the same potential by means of the saw-tooth voltage. The current source for the lefthand differential amplifier is the transistor $T_{12}$ and the current source for the right-hand differential amplifier is the transistor $T_{13}$. As the transistors $T_{12}$ and $T_{13}$ are equal and belong to a current mirror circuit together with the transistor $T_{10}$ connected as a diode, the transistors $T_{12}$ and $T_{13}$ supply the same current.

The supply of current is effected into the directly connected emitters of the first and second transistor of each differential amplifier. The bases of the second transistors $T_{15}$ and $T_{18}$ receive different bias voltages which are supplied by a voltage divider. This voltage divider comprises the resistors $R_9$, $R_{11}$ and $R_{12}$. The bias for the base of the transistor $T_{15}$ is the tapped voltage between the resistors $R_9$ and $R_{11}$ reduced by the base-emitter voltage of the emitter follower transistor $T_{19}$. The bias for the base of the transistor $T_{18}$ is obtained from the tapped voltage between the resistors $R_{11}$ and $R_{12}$ deducting the base-emitter voltage of the emitter follower transistor $T_{20}$.

The collector of the first transistor $T_{16}$ of the left-hand differential amplifier and the collector of the second transistor $T_{18}$ of the right-hand differential amplifier have the common collector-resistor $R_6$ while the collectors of the transistors $T_{15}$ and $T_{17}$ are connected to the reference potential.

Figure 2A:
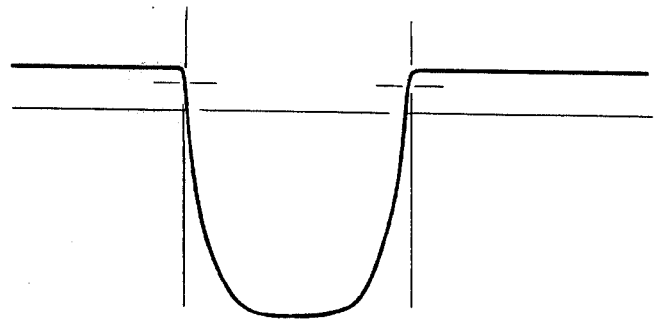
FIG. 2a shows a line flyback pulse occurring at the input 1 of FIG. 1.

The transistors $T_{12}$ and $T_{13}$ are conductive only as long as the negatively directed line flyback pulse is present at input 1. In the remaining time during the line scan the transistors $T_{12}$ and $T_{13}$ are blocked. Similarly the saw-tooth voltage (FIG. 2b) which occurs at point 2 and is supplied to the bases of $T_{16}$ and $T_{17}$ via the emitter follower comprising the transistor $T_{14}$ and the resistor $R_5$, is only present during the duration of the line flyback pulse (FIG. 2a).

Figure 2B:
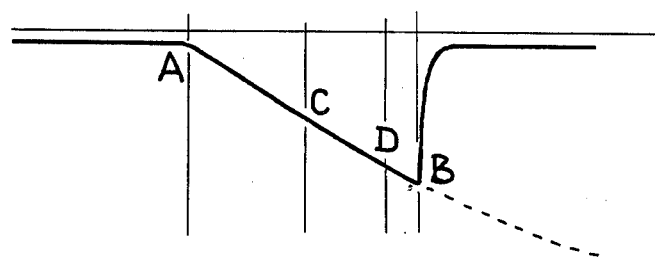
FIG. 2b shows a sawtooth waveform which occurs at point 2 in the circuit of FIG. 1, FIG. 2c indicates the voltage waveform occuring at the base electrode of transistor $T_{10}$ shown in FIG. 1.

According to FIG. 2b the saw-tooth voltage runs synchronously in terms of time with the input pulse and in fact it runs from the point A, which corresponds to the supply voltage reduced by the saturation voltage of transistor $T_4$, up to point B, which corresponds to the end of the input pulse. The sawtooth voltage runs from fairly high to fairly low voltage values in the embodiment.

If the transistor $T_{12}$ is conductive then the current flows away from $t_{12}$ either via the transistor $T_{15}$ or via the transistor $T_{16}$, according to which of the two transistors is conductive at the time. At the beginning of the saw-tooth voltage the transistor $T_{15}$ is conductive. This stage changes if the saw-tooth voltage applied to the base of $T_{16}$ falls below the base bias of the transistor $T_{15}$ (point C in FIG. 2b) so that the transistor $T_{15}$ is changed from the conductive to the blocking state and $T_{16}$ is now conductive. As a voltage drop coming from the current of the transistor $T_{12}$ only occurs at the resistor $R_6$ when the transistor $T_{16}$ is conductive then the pulse according to FIG. 2d is produced at the resistor $R_6$ because of the current of $T_{12}$.

Figure 2C:
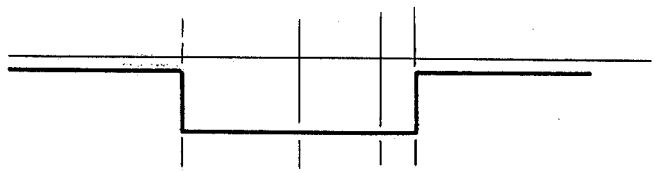
FIG. 2d shows a voltage waveform component occurring across th resistor $R_6$ due to current flowing through transistor $T_{12}$.
FIG. 2e shows a voltage waveform component occuring across the resistor $R_6$ due to current flowing through the transistor $T_{13}$.
FIG. 2f shows the actual stepped voltage waveform occuring across resistor $R_6$ which waveform is formed by the combined currents flowing through transistors $T_{12}$ and $T_{13}$ in FIG. 1.
Figure 2D:
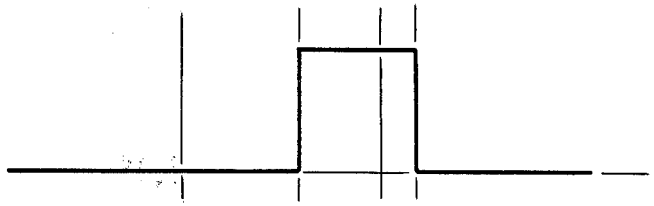
Figure 2E:
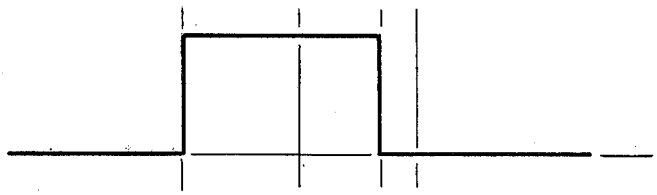

However, besides the voltage which results from the current of the transistor $T_{12}$ yet another voltage drop occurs across resistor $R_6$ in accordance with FIG. 2e, which results from the current of the transistor $T_{13}$. As FIG. 2e shows this voltage drop occurs immediately with the input pulse, wherein the current resulting from the transistor $T_{13}$ flows through the conductive transistor $T_{18}$. Only if the saw-tooth voltage has reached the point D in FIG. 2b does the transistor $T_{17}$ become conductive instead of transistor $T_{18}$ so that the voltage drop at $R_6$, which results from the current of the transistor $T_{13}$ stops.

Figure 2F:
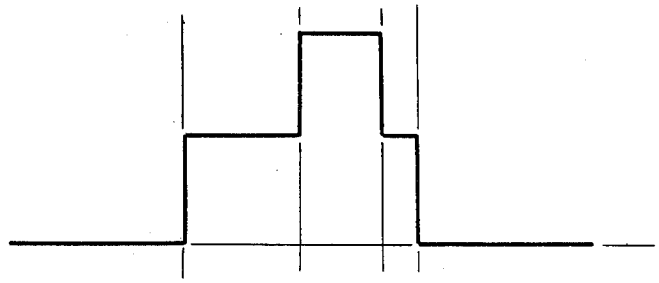

The addition of the voltage curves of FIGS. 2d and 2e gives the desired step-shaped pulse of FIG. 2f. The stepped pulse reaches output 3, where it is available with low source resistance, via the emitter follower comprising the transistor $T_{21}$ and the resistors $R_{10}$ and $R_{13}$.

The saw-tooth voltage occurs at the RC network which is connected to the point 2 externally, and is formed from a resistor $R_{14}$ and a capacitor C. As the saw-tooth voltage should be available synchronously in terms of time with the input pulse, an electronic switch is provided which short-circuits the capacitor C during lines scanning. This switch is formed by a transistor $T_4$. If $T_4$ is conductive then a current flow from $T_4$ to the point 2 and to earth via the resistor $R_{14}$. $R_{14}$ is so dimensioned that the voltage drop at $R_{14}$ is sufficient to drive the transistor $T_4$ into saturation. During the scanning of the line there is a voltage at point 2 which is equal to the difference between the supply voltage and the saturated voltage of the transistor $T_4$.

As the transistor $T_4$ becomes conductive or blockes so becomes the transistor $T_5$ also conductive or blocked in time therewith, since the transistors $T_4$ and $T_5$ together with the transistor $T_3$, which is connected as a diode, form a current mirror circuit. The current through the switching transistor $T_5$ flows away to earth via the resistor $R_4$. The resistor $R_4$ is so dimensioned that the transistor $T_5$ is driven into saturation by the voltage drop at $R_4$. This is the case during the scanning of the line. In this condition no current flow through the transistor $T_{10}$, which is connected as a diode, during scanning of the line. During the line flyback pulse the transistors $T_5$ is blocked and the current through $R_4$ flows via the transistor $T_{10}$ which is connected as a diode. The course shown in FIG. 2c then takes place at the basecollector connection of $T_{10}$, wherein the voltage during the pulse is the difference between the supply voltage and the base-emitter voltage from $T_{10}$. As the transistor $T_{10}$ belongs to a current mirror circuit together with the transistors $T_{12}$ and $T_{13}$ then $T_{12}$ and $T_{13}$ supply current only during the line flyback pulse.

The negatively directed line flyback pulse which is applied at input 1 reaches the base of transistor $T_6$ via the transistor $T_1$ which is connected as a diode. The transistors $T_6$ and $T_7$ form a differential amplifier. The bias of the transistor $T_7$ is equal to the tapped voltage between resistor $R_2$ and $R_3$ of a voltage divider formed from the resistors $r_2$ and $r_3$ and from a transistor $T_9$ which is conncted as a diode. The transistor $T_8$ and the transistor $T_9$ form a current mirror circuit so that the same currents flow through $T_8$ and through $T_9$.

During the scanning of the line the potential at the base of the transistor $T_6$ must be above the base bias of the transistor $T_7$ so that the current supplied by the current source transistor $T_8$ flows via $T_6$ and the transistor $T_3$ which is connected as a diode. As $T_3$, $T_4$ and $T_5$ belong to a current mirror circuit current also flows through $T_4$ and $T_5$ at the same time as the current through $T_3$, wherein $T_4$ and $T_5$ are driven to saturation, as already mentioned.

In order that during the scanning of the line the base potential of the transistor $T_6$ is above the base potential of the transistor $T_7$ the potential at input 1 must be greater than the base bias of transistor $T_7$ plus the voltage of the base-collector diode of the transistor $T_1$ which is connected as a diode. The transistors $T_1$ and $T_2$, which are connected as diodes, together with the resistor $R_1$ form a series circuit wherein the tapping between the collector of $T_1$ and the resistor $R_1$ is connected to the base of the transistor $T_6$.

As a result of the negatively directed line flyback pulse the base potential of the transistor $T_6$ is brought below the base bias of the transistor $T_7$ so that $T_6$ is now blocked and thus $T_7$ is conductive. At the same time the current stops flowing through the transistor $T_3$, which is connected as a diode, and this has the result that also the transistors $T_4$ and $T_5$ belonging to the current mirror circuit are switched from the conductive into the blocked state.

Instead of the normally used base-emitter diode the base-collector diode of the input transistor $T_1$ is used in order to obtain a high blocking voltage and in order to be able to supply the line flyback pulse with an amplitude the value of which is higher than the supply voltage by a multiple.

It will be understood that the above description of the present invention is susceptible to various modification changes and adaptations.

What is claimed is:

1. A circuit for producing a stepped pulse, comprising: at least two differential amplifiers each composed of a first transistor and a second transistor, with the bases of said first transistors of said at least two differential amplifiers being connected together; means connected for supplying to said bases of said first transistors a sawtooth voltage which varies between end potential values; means connected to the bases of said second transistors of said at least two differential amplifier for supplying to each said second transistor base a respectively different potential having a value between said sawtooth voltage end potential values; a common collector resistor connected to the collector of said first transistor of one said amplifier and to the collector of said second transistor of the other said amplifier; and means connected for supplying operating current of identical value to both said amplifiers.

2. An arrangement as defined in claim 1 wherein the end potential values of said sawtooth voltage are set for causing each said differential amplifier to operate in such a manner that one transistor thereof switches to its nonconducting state and the other transistor thereof switches to its conductive state when said sawtooth voltage passes through a value between its end values.

3. An arrangement as defined in claim 1 wherein said means for supplying operating current comprise a transistor mirror circuit.

4. An arrangement as defined in claim 1 wherein said means supplying a sawtooth voltage comprise an RC network, and further comprising a switch connected in parallel with the capacitor of said network and operative to short-circuit said capacitor during intervals when said sawtooth voltage is not required.

5. An arrangement as defined in claim 1 further comprising: a further differential amplifier composed of a first transistor and a second transistor, with the emitters of said first and second transistors of said further amplifier being connected together; a third transistor connected between said emitters of said further amplifier transistors and a source of a reference potential; a current mirror circuit including a transistor connected as a diode and connected to the collector of said first transistor of said further amplifier; a source of supply voltage connected directly to the collector of said second transistor of said further amplifier; input means connected for supplying an input pulse to the base of said first transistor of said further amplifier; bias means connected to the base of said second transistor of said further amplifier for applying to said second transistor base a bias voltage having a value such that the supply of an input pulse by said input means causes said first transistor of said further amplifier to be blocked and said second transistor of said further amplifier to be conductive, and absence of an input pulse causes the conductive states of said first and second transistors of said further amplifier to be reversed; and means connected between said further amplifier and said means for supplying a sawtooth voltage and for supplying operating current and operative to initiate such sawtooth voltage and the supply of such operating current in response to supply of an input pulse by said input means.

6. An arrangement as defined in claim 5 wherein said input means comprises an additional transistor connected as a diode and arranged to supply such input pulses via its base-collector path to said base of said first transistor of said further amplifier.

7. A stepped pulse generator circuit comprising: an input line for supplying a sawtooth voltage; an output line for providing a voltage pulse having a steeped waveform; first and second differential amplifiers each comprising first and second transistors, said first transistor of each said differential amplifier having its base electrode coupled to said input line; a common load resistor for said differential amplifiers coupled to the collector electrode of said first transistor of said first differential amplifier, to the collector electrode of said second transistor of said second differential amplifier, and to said output line; biassing means coupled with the base electrode of said second transistor of said first differential amplifier and with the base electrode of said second transistor of said second differential amplifier for providing respectively different bias potentials thereto; and current supply means coupled with the emitter electrodes of said transistors of said first and second differential amplifiers.

* * * * *